United States Patent [19]

Jewer

[11] Patent Number: 4,519,054
[45] Date of Patent: May 21, 1985

[54] METHOD FOR FORMATTING OPTICALLY ENCODED DIGITAL DATA ON A SUBSTRATE AND THE DATA RECORD CARRIER FORMED THEREBY

[75] Inventor: Alan A. Jewer, Whitewater, Wis.

[73] Assignee: News Log International, Inc., Janesville, Wis.

[21] Appl. No.: 404,507

[22] Filed: Aug. 2, 1982

Related U.S. Application Data

[63] Continuation-in-part of Ser. No. 384,582, Jun. 3, 1982.

[51] Int. Cl.³ .............................................. G11B 7/00
[52] U.S. Cl. ........................................ 369/30; 369/32; 369/44; 369/59
[58] Field of Search ...................... 235/462, 487, 494; 369/59, 44, 32, 30

[56] References Cited

U.S. PATENT DOCUMENTS

| | | | |
|---|---|---|---|
| 3,708,748 | 1/1973 | Nassimbene | 235/462 |
| 3,891,794 | 6/1975 | Russell | 369/59 |
| 3,898,629 | 8/1975 | Westerberg | 369/97 |
| 3,961,315 | 6/1976 | Yokoyama | 369/59 |
| 4,296,491 | 10/1981 | Jerome | 369/59 |
| 4,308,455 | 12/1981 | Bullis | 235/463 |
| 4,321,635 | 3/1982 | Tsuyuguchi | 369/32 |
| 4,348,659 | 9/1982 | Fujimori | 369/59 |
| 4,363,116 | 12/1982 | Kleuters | 369/32 |

Primary Examiner—Harold I. Pitts
Attorney, Agent, or Firm—Thomas R. Vigil

[57] ABSTRACT

The method for formatting optically encoded digital data on a planar substrate (11) without timing or synchronization data to form a data record carrier (10) includes the steps of: selecting an accuate track path on the substrate (11) for each one of a plurality of arcuate tracks (14, 14a, 14b) of data (12); selecting a data cell length (15) in the direction of each track (14) for each bit of data to be stored in each cell (15) on each track (14); selecting a cell width dimension transverse to the direction of the track (14); selecting a non-transition cell (A, C) for one form of logic (0 or 1) to be stored in each such cell (15); selecting a transition cell (B) for the other form of logic (1 or 0) to be stored in each such other cell (15); establishing a leader section (22) for each track (14); establishing a tailer section (24) for each track (14); establishing a front track address section (32) for each track; establishing a back track address section (44) for each track (14) and creating the tracks (14a and 14b) with the above parameters on a substrate (11) with each track (14) being spaced from an adjacent track (14) by a predetermined distance along a common centerline of the tracks (14) and with each track (14) having the same radius throughout the arcuate path of the track (14) such that the tracks (14) extend in an arcuate manner across the data record carrier (10) and are arranged in a nested manner relative to adjacent tracks (14) along the common centerline to form the data record carrier (10). Preferably, the tail end of each track (14) is a mirror image of the leading end of the track (14) to facilitate locating and identifying each track reading forward or backward. Also, coded groups (34, 42 or 50, 52) are formed on each track between the ends thereof with the coding thereof facilitating error detection and error correction.

47 Claims, 6 Drawing Figures

METHOD FOR FORMATTING OPTICALLY ENCODED DIGITAL DATA ON A SUBSTRATE AND THE DATA RECORD CARRIER FORMED THEREBY

CROSS REFERENCE TO RELATED APPLICATIONS

This application is a continuation-in-part of U.S. application Ser. No. 384,582 filed on June 3, 1982 and entitled: METHOD FOR OPTICALLY ENCODING DIGITAL DATA ON A SUBSTRATE AND THE DATA RECORD CARRIER FORMED THEREBY and is related to U.S. application Ser. No. 625,573 filed June 28, 1984 and entitled: A DIGITAL DATA RECORD, which is a continuation of U.S. application Ser. No. 290,475 filed on Aug. 6, 1981.

BACKGROUND OF THE INVENTION

1. Field of the Invention

The present invention relates to a method for formatting optically encoded digital data in and along tracks on a substrate and the date record carrier formed thereby. More specifically, the present invention relates to the formatting of information about the data on the data record carrier in a first or zero track and then formatting the data itself in successive tracks on the data record carrier. The tracks are preferably arcuate tracks of equal radii that are arranged in a nested array of tracks equally spaced from one another on the substrate.

2. Description of the Prior Art

Heretofore it has been proposed in U.S. Pat. No. 4,213,040 to encode digital information in rows and columns on a record carrier. Data is read from the record carrier by movement of the record carrier on an X axis and rotation transport mechanism which is operable to make skew corrections.

Also heretofore various optical encoded data record carriers and optical "writers" and "readers" have been proposed. For example, in U.S. Pat. No. 3,549,897 there is disclosed an absolute electro-optical encoder for indicating the angular position of a shaft. The encoder includes a stationary disc and a rotary disc, the discs having concentric tracks with transmissive and non-transmissive portions which are binarily related. Light passing through the discs is picked up by certain selected combinations of photocells for indicating the position of one disc relative to the other disc.

In U.S. Pat. Nos. 3,501,586; 3,624,284; 3,885,094; 3,795,902; 3,806,643; 3,891,794; 4,090,031 and 4,163,600 issued to J. Russell, various "writers" and "readers" are disclosed for "writing" digital data on a spiral track and for "reading" digital data from the spiral track. In the optical encoding and decoding systems described in these patents opaque spots on the track correspond to logic 1 bits of binary data and transparent spots on the track correspond to logic 0 bits of binary data. Also, larger synchronization spots are provided at different places along the track.

An apparatus for scanning a data record medium is disclosed in U.S. Pat. No. 3,898,629 wherein binary digital information is recorded in the form of data along a circular arc and a plurality of such circle arcs of data information are arranged tightly adjacent each other.

In U.S. Pat. No. 3,919,697 there is disclosed a data record having track lines which may be separate parallel tracks or may be a single series track of the spiral or raster type.

In U.S. Pat. No. 3,983,317 there is disclosed an astigmatizer for a laser recording and reproducing system. In this system concentric circular tracks are formed in a thermoplastic record or disc by burning selected holes through the disc with a laser. The laser is "on" while the disc is being rotated a short distance to form an elongate data information bit in the track. Then, in reading the data the laser beam or spot is elongated in a direction transverse to the direction of the track with an astigmatizer unit so that a small elongate beam of light with an axis extending transverse to the axis of the track and of the elongate opening therein is used to read the opening.

In U.S. Pat. No. 4,094,010 there is disclosed an optical multi-channel digital disc storage system. Data is stored on a spiral information track and holes corresponding to the information data are burned into the material of the disc by an information radiation beam.

U.S. Pat. No. 4,094,013 discloses an optical storage disc system with disc track guide sectors wherein the data tracks are spiral shaped turns or concentric turns on the disc. The data stored is again in the form of holes burned into the disc.

U.S. Pat. No. 4,209,804 discloses a record carrier containing information in an optically readable radiation reflecting information structure. With the record carrier of this patent, data is stored in a spiral track on a disc in the form of information areas comprising pits pressed into the record carrier surface or hills projecting from the record carrier surface. According to the teachings of this patent, the depth of the pits or the height of the hills is constant and so is the width of the information areas and intermediate areas at the level of the plane of the lands. Then the information to be conveyed by the record carrier is contained in the variation of the structure of the areas in the tangential direction only. More specifically, the information areas are substantially V-shaped, the phase depth of each information area having one value between 100° and 120° and the angle of inclination between the walls of the information areas and normal to the record carrier are substantially constant and have a value between 65° and 85°.

As will be described in greater detail hereinafter, the present invention differs from the record media and carriers disclosed in the prior art patents referred to above by providing a method for formatting optically encoded binary/digital data in tracks on a substrate of a record carrier and the data record carrier formed thereby. In particular, each track of data has a leading end comprising a leader section and front track address section at the beginning of the track and a tail end comprising a back track address section and a tailer section at the end of the track. The tail end of each track is a mirror image of the leading end of the track. That is to say, the tailer and back track address sections are a mirror image of the leader and front track address sections.

Moreover, in accordance with one aspect of the present invention, a plurality of coded groups of digital data containing information carried by the data record carrier are positioned in each track between the front track address section and the back track address section.

Furthermore in accordance with another aspect of the present invention, the first or zero track has coded groups containing information that is only read by a computer associated with a reader or scanning device.

By formatting the tracks with a tail end which is a mirror image of the leading end and by storing data on the tracks in coded groups, one can easily find out which track is being read by a reader or scanning device and with the data being coded, a "best guess" can be made of any data that may be missing due to an error, such as a "burst error" in the data on a track in the data record carrier such as a burst error caused by a hole punched through the data record carrier.

Also, a plurality of the arcuate tracks of the cells are created on a substrate with each track being spaced from an adjacent track by a predetermined distance at a point intermediate the ends of each track, and each track has the same radius throughout the arcuate path of the track such that the tracks extend in an arcuate manner across the data record carrier with each track having the same radius and being arranged in a nested manner relative to adjacent tracks along a common centerline.

SUMMARY OF THE INVENTION

According to the invention there is provided a method for formatting optically encoded digital data on a planar substrate without timing or synchronization data to form a data record carrier including the steps of: an arcuate track path on the substrate for each one of a plurality of tracks of data; selecting a data cell length in the direction of each track for each bit of data to be stored in each cell on each track; selecting a cell width dimension transverse to the direction of the track; selecting a non-transition cell for one form of logic (0 or 1) to be stored in each such cell; selecting a transition cell for the other form of logic (1 or 0) to be stored in each such other cell; establishing a leader section for each track; establishing a tailer section for each track; establishing a front track address section for each track; establishing a back track address section for each track and creating on said substrate a plurality of such arcuate tracks with the above parameters, and with each track being spaced from an adjacent track along a common centerline of the tracks, and each track having the same radius throughout the arcuate path of the track such that the tracks extend in an arcuate manner across the data record carrier and are arranged in a nested manner relative to adjacent tracks along said common centerline.

Further according to the invention there is provided a data record carrier without timing or synchronization data, said data record carrier including a plurality of arcuate spaced apart tracks on a planar substrate with each track having a plurality of data cells therein, each track being spaced from an adjacent track by a predetermined distance along a common centerline of the tracks and each track having the same radius throughout the arcuate path of said track such that the tracks extend in an arcuate manner across the data record carrier and are arranged in a nested manner relative to adjacent tracks along a common centerline, each cell having the same cell length in the direction of each track for each bit of data stored in each cell and the same cell width in a direction transverse to the direction of each track; each cell for one form of logic (0 or 1) being a non-transition cell, each cell for the other form of logic (1 or 0) being a transition cell, and each track having a leader section, a tailer section, a front track address section and a back track address section.

Still further according to the invention there is provided a method for optically encoding digital data without timing or synchronization data on a planar surface to form a data record carrier including the steps of: selecting arcuate track paths on the substrate; selecting a data cell length in the direction of the track for each bit of data to be stored in each cell on each track; selecting a cell width dimension transverse to the direction of the track; selecting a non-transition cell for one form of logic (0 or 1) to be stored in each such cell; selecting a transition cell for the other form of logic (1 or 0) to be stored in each such other cell; creating a plurality of arcuate tracks of digital data on the substrate comprised of a series of said cells each having the same cell length in the direction of the track, said plurality of tracks being arranged in a nested array of tracks equally spaced from each other by a predetermined distance, along a common centerline of said tracks, each track having the same radius throughout the arcuate path of said track such that the tracks extend in an arcuate manner across the data record carrier, and said predetermined distance being a center-to-center spacing between adjacent tracks of 0.001 inch to 0.011 inch and each said track having a thickness of 0.0007 inch to 0.010 inch.

Additionally, according to the invention there is provided a data record carrier without timing or synchronization data, said data record carrier including a planar substrate and digital data on the substrate in the form of a plurality arcuate of tracks each having therein a plurality of data cells for each bit of data (0 or 1) stored therein, each cell having the same cell length in the direction of the track and the same cell width in a direction transverse to the direction of the track, each cell for one form of logic (0 or 1) being a non-transition cell and each cell for the other form of logic (1 or 0) being a transition cell, each track being spaced from an adjacent track by a predetermined distance along a common centerline of said tracks, each track having the same radius throughout the arcuate path of said track such that the tracks extend in an arcuate manner across the data record carrier and are nested relative to adjacent tracks along said common centerline, and said predetermined distance being a center-to-center spacing between tracks of 0.001 inch to 0.011 inch and each track having a thickness of 0.0007 inch to 0.010 inch.

DESCRIPTION OF THE PREFERRED EMBODIMENT

Figure 1:
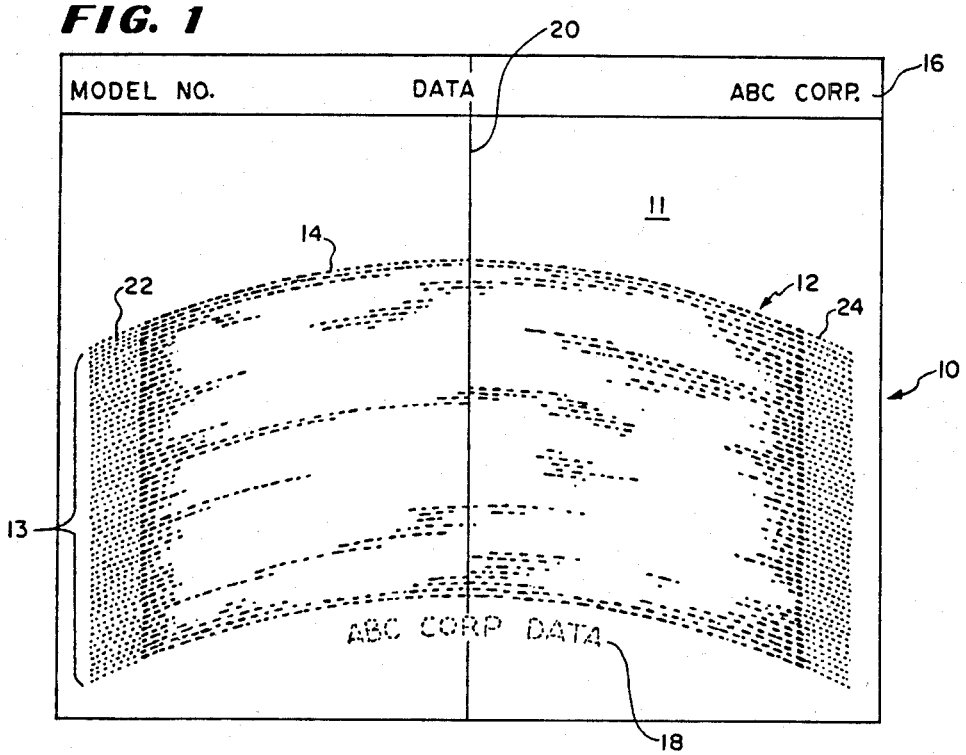
FIG. 1 is a plan view of a data record carrier constructed and arranged in accordance with the teachings of the present invention.

Referring now to the drawings in greater detail there is illustrated in FIG. 1 a data record carrier 10 constructed in accordance with the teachings of the present invention. The data record carrier 10 includes a substrate 11 which can be made from a number of different materials. For example, it can be made from paper, paperboard, coated enamel paper, plastic filament paper, Mylar$_{TM}$, Kodalith Pan$_{TM}$, Tri-X Pan$_{TM}$, Plus-X Pan$_{TM}$, dry silver, Tri-X$_{TM}$, Plus-X$_{TM}$, diazol, or vesicular materials.

In one preferred embodiment, the substrate 11 is made of a film negative material and a mask or master netative data record carrier 10 is made photographically. The data 12 is represented by transparent or clear areas and dark or opaque areas. A preferred size of this master negative is approximately 4 inches by 6 inches, which is the standard size for microfiche negatives.

Once a mask or film negative data record carrier 10 has been made, such negative or mask can be reproduced or utilized for printing inexpensive data record carriers 10 on an inexpensive substrate 11 material such as paper or paperboard materials.

In the case of a data record carrier 10 which has a substrate 11 made from film negative material, data 12 is optically encoded therein in the form of a plurality 13 of tracks 14 utilizing photographic techniques.

In this respect, and as will be described in greater detail hereinafter, a camera is utilized to create cells 15 (FIGS. 2 and 3) in each track 14 where each cell 15 has a predetermined length L (FIG. 2) along the direction of the track and a predetermined width W (FIGS. 2 and 3) transverse to the direction of the track 14. Each cell 15 is transparent or opaque or portions thereof are transparent or opaque to define a certain logic state in the cell in accordance with the teachings of the present invention and as will be described in greater detail hereinafter.

Once a mask or master film negative form of data record carrier 10 is made, such a mask can be utilized for the printing of data record carriers 10 on a paper or paperboard substrate 11.

When the data 12 is printed, the cells 15 are either reflective or non-reflective or partially reflective and partially non-reflective to represent different logic states, namely logic 0 or logic 1.

The substrate 11 can also have printed thereon other pertinent data in a header section 16.

In the embodiment shown in FIG. 1, the data record carrier 10 shown is utilized for storing information relating to a parts list, price list, and other pertinent data relative to a product sold under a particular model number by a particular company. Other data or a repeat of the data in the header section 16 can also be printed on the substrate 11 beneath the data 12 in the same manner the cells 15 of each track 14 are printed as shown at 18 in FIG. 1.

Figure 3:
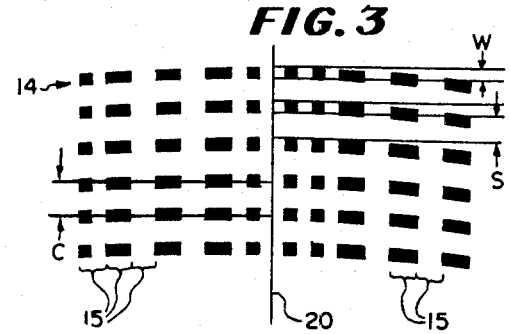
FIG. 3 is an enlarged view of the center portion of the data tracks shown in FIG. 1.

As will be described further in connection with the description of FIGS. 3, 4, and 5, when the data record carrier 10 is formed on a film negative substrate 11, each cell 15 having a given cell length L and a given cell width W that will represent one form of logic, logic 0 or logic 1, will be completely transparent or completely opaque. In other words, there will be no transition across the length of the cell and such cell is referred to as a non-transition cell and in this description will correspond to a logic 0 data bit.

Then, for adjacent cells, which will be characterized as containing a logic 1 data bit, part of the cell extending in a direction transverse to the direction of the track 14 will be opaque and the remaining part of the cell extending transverse to the direction of the track 14 will be transparent or vice versa. As a result, there is a transition intermediate and typically midway across the length L of the cell 15 from transparent to opaque or opaque to transparent. As a result, an optical reader having a light source which passes light directly, or via fiber optics, to the substrate 11 of the data record carrier 10 as the reader is moving arcuately along a track 14 will sense no transition along a cell 15 length L but will sense a transition (opaque to transparent or vice versa) when there is a transition intermediate the edges of a cell 15. Such optical information is converted to electrical signals by a photosensor moving with the reading head and sent to a microprocessor which has been programmed to sense when there has been a transition over a cell length and when there has not been a transition over the length of a cell 15 and to then generate a corresponding logic 0 or logic 1 data bit of information which is supplied to a random access memory.

It is important to note, however, that according to the teachings of the present invention, data is encoded in the form of a transition or a non-transition in each cell 15 so that there is no lost space between cells 15 and cells 15 can be made as small as present technology permits.

Referring again to FIG. 1, it will be apparent that each of the tracks 14 is arcuate and such tracks are created by moving a camera in an arcuate path. As taught in copending U.S. application Ser. No. 625,573 filed June 28, 1984 and entitled: A DIGITAL DATA RECORD which is a continuation of application Ser. No. 290,475, filed Aug. 6, 1981, and entitled: A DIGITAL DATA RECORD, each of the tracks 14 has the same radius and this radius is constant over the length of the track 14. Also, each track 14 of the plurality 13 of tracks 14 are spaced apart from one another a predetermined distance S (FIG. 3) with each track 14 extending in an arcuate manner across the substrate 11 of the data record carrier 10 so as to be arranged in a nested manner, again with each track 14 having the same radius.

In this way, the data record carrier 10 can be positioned on a carrier on transporter of a reader and once proper alignment has been obtained, the data record carrier 10 can be indexed along an axis 20 which is colinear with a line that extends across the data record carrier 10 and is colinear with a radius of each data track 14.

In reading data from the data record carrier 10, a rotating reader or scanner heat will rotate over the first track 14 on a rotation thereof picking up and reading the data encoded on the track 14 and then while the reading head or scanner is completing a revolution around its rotating axis, the data record carrier 10 is indexed along the line or axis 20 a distance S from the first track 14 to the second track 14 and so on for each successive track 14.

When the data record carrier 10 substrate 11 is made of a non-energy transmissive material, such as a paper or paperboard material, and the data 12 is optically encoded in the cells 15 by forming a non-transition logic 0 cell 15 with a fully reflective or fully non-reflective surface and a transition logic 1 cell 15 with a portion of the cell 15 being reflective and another portion being non-reflective, then the reader will be of the type which directs light onto the surface of the data record carrier 10 and which has a sensor adjacent the point of light emission for sensing reflected light from reflective areas.

From empirical tests and experiments with different substrate materials, different sizes of substrates, different cell widths, different cell lengths, and different radii for the tracks, a number of parameters have been determined. For example, it has been determined that a very useable data record carrier 10 is provided when the track 14 radius is between 4 and 18 inches and that a preferred radius for each track 14 is somewhere between 8 and 12 inches.

Also it has been determined empirically that for a track 14 radius of between 4 and 18 inches the arc subtended by the track can be between 120° and 30°.

More specifically, for tracks 14 having a radius of somewhere between 8 and 12 inches, a preferred arc subtended by the track 14 is 60° wherein at least 45° of the arc of the track 14 contains information data.

Figure 2:
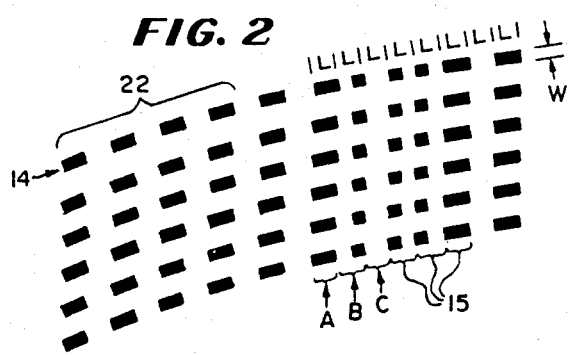
FIG. 2 is an enlarged view of the upper left hand corner of the data tracks formed on and in the substrate of the data record carrier shown in FIG. 1.

Referring now to FIG. 2 there is illustrated therein the beginning of the first six tracks 14 shown at the upper left hand corner of the plurality 13 of tracks 14 on the substrate 11 of the data record carrier 10 in FIG. 1.

Typically, at the beginning and at the end of each track 14, a leader 22 and a tailer 24 are provided, each composed of a series of non-transition logic 0 cells 15 where no transition occurs across the length L of each cell 15. Thus, the length L of the cell 15 would be fully non-reflective (or opaque) or fully reflective (or transparent) and would alternate that way until an address portion of the track 14 is reached.

As shown in FIG. 2, the beginning of the track address is shown with four logic 0 cells, the first one being a fully transparent (or transmissive) cell 15, the next one being a fully non-reflective (or opaque) cell 15, etc. through four cells 15 to cell A. Then there is shown a transition cell B which has the first portion thereof reflective (transmissive) and a second portion thereof non-reflective (opaque). The next cell C is a logic 0 cell and is fully reflective (or transmissive). The succeeding cells 15 are a transition cell the first portion of which is non-reflective (opaque) and the second portion of which is reflective (transmissive) followed by another transition cell 15 and then two non-transition cells 15.

It has been determined empirically that a useful cell length L for optically encoded data is between 0.002 inch and 0.020 inch. A cell length L which is preferred with respect to high compacting of data and which provides a sufficient cell length to facilitate encoding and reading of the data 12 is approximately 0.006 inch. The width W of each cell 15, which is not drawn to scale in FIGS. 2 and 3, can be between 0.0007 inch and 0.010 inch. A very suitable cell width dimension W in the direction extending transverse to the direction of the track has been found to be from 0.002 inch to 0.008 inch.

It also has been found empirically that a very suitable spacing S for the nested arcuate tracks 14 is a dimension which is 10 to 30 percent of the width W.

Thus, the spacing S taken along the center line or axis 20 on which the tracks 14 are arrnaged or nested as shown in FIG. 1 can be as small as 0.0002 inch.

As further empirical tests are made and advances are made in microtechnology techniques, further compression may be available. Presently a center-to-center track spacing C of between 0.001 inch and 0.011 inch with a track width or thickness between 0.0007 and 0.010 inch have been found empirically to be practical and workable dimensions.

It will be appreciated that the spacing between the tracks 14 at the beginning of the tracks 14 and at the ends of the tracks 14 will be less than the spacing S in the middle along line 20. In fact, if one were to extend the tracks 14 another 60°, a total of 90° from either side of the line 20, they would converge toward each other and eventually intersect. Thus, although the arcuate tracks 14 appear to be parallel spaced, they are, in reality, equal radii tracks that are arranged in a nested array with a space in one embodiment of between 0.007 and 0.010 inch from each other at the place (along the line 20) of maximum spacing.

Figure 4:
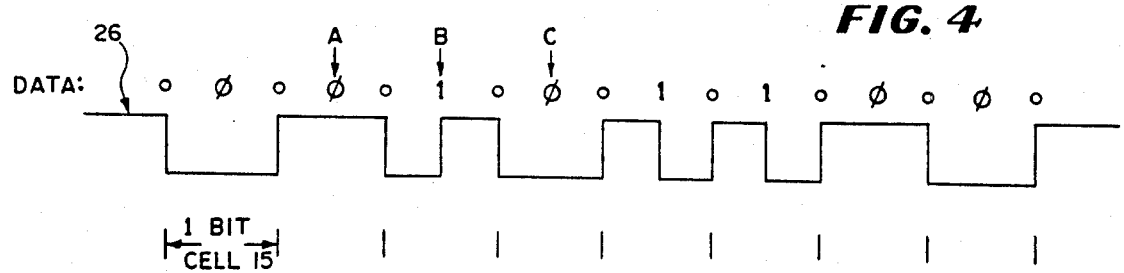
FIG. 4 is a graph of the electrical signal generated by the light energy transmitted or reflected or not transmitted or not reflected across each cell of part of a track shown in FIG. 2 with the corresponding logic state stored in the cell indicated thereabove.

In FIG. 4 is shown a waveform 26 of the electrical signal generated from an optical reading of the data in the first track 14 shown in FIG. 2. Here it is apparent that a fully transmissive or reflective cell 15 and a fully non-transmissive or non-reflective cell 15 corresponds to a data bit of logic 0 in that cell 15. Thus, starting with a first cell 15 which is identified as cell A, there is a fully non-transmissive (opaque) or fully non-reflective surface thereon on a substrate 11 such that there is no transition across the length L of the cell as a reader passes along that track 14 over that cell A and the logic of that data bit is logic 0.

Then, the next cell B is partially transmissive or reflective and partially non-transmissive or non-reflective so as to cause a square waveform in signal 26 for cell B. This corresponds to a logic 1 data bit as shown. The next cell C is a non-transition cell C which is fully transmissive or fully reflective. The succeeding cells 15 shown in FIG. 4 are transition, transition, non-transition, non-transition and non-transition.

It is to be appreciated that by establishing logic in the form of a transition or non-transition over a given cell length L, such as a cell length of 0.006 inch, the optically encoded data 12 in the track 14 on or in the substrate 11 of the data record carrier 10 can have a wide degree of tolerance with respect to the sharpness or fuzziness of cell edges or the point of transition in the cell 15. In other words, the data 12 can be tolerant of a lot of noise. In this respect, it is not essential that a transition take place within a very confined area of the cell length L. As a result, the position of the cell edge or the position of a transition in a cell or the sharpness of either can vary up to at least 25% of the desired intended location of the cell edge or transition with the data still being highly readable. In this respect, the beginning of the non-reflective area of cell A could be 25% to the left or right of the beginning edge of cell A and the optical sensing and resulting electrical signal generated by the optical sensing would still be able to indicate to a microprocessor that there was no transition over the major length of the cell and that therefore the data bit stored in cell A is logic 0.

Likewise, if the transition in a transition cell such as the cell B occurs somewhere to the right or left of the middle of the cell B, up to at least 25% on either side of the middle of cell B, there will still be a transition over the length L (timewise and distancewise) of cell B to indicate to a microprocessor that a logic 1 data bit is stored in cell B.

As a result, by utilizing the optical transition or non-trasition across a cell length L for encoding logic values in the cells 15, i.e., a logic 0 or logic 1, a very efficient and effective data record carrier 10 is provided.

Further in this regard, cell spacing is not required since the microprocessor is only concerned with the transition. Thus a series of logic 0 cells 15 are defined by alternating fully reflective (transmissive) and fully non-reflective (non-transmissive) cells 15 and transition cells 15 for the other form of logic, namely logic 1, are identified by any cell where there is a transition between a reflective (transmissive) area and a non-reflective (non-transmissive) area within a cell 15 across the length L of the cell 15.

Additionally, and as noted above, since transitions are being sensed within a cell 15, the cell edge for a non-transition cell 15 or the position of transition within a cell 15 for a transition cell 15 need not be precise and fuzziness and inaccuracy in the position of such transition can be tolerated at least up to 25% of the intended location of the cell edge or position of transition within the cell 15. This makes the optically encoded data very tolerant to noise and very tolerant of errors in printing, or even inaccuracies in the location of printing of a cell edge or transition in a cell 15. The data record carrier 10 is also tolerant of substrate dimensional changes, such as, but not limited to, thermal, chemical, or mechanical changes. It is also tolerant of localized or universal changes to the substrate, such as, for example, changes due to moisture.

In practicing the method of the present invention in creating a data record carrier 10 one will first select a track path on the substrate 11 which is defined by the radius of the track 14 and the arc to be subtended by the track 14.

Next a cell length L in the direction of the track 14 is selected for each bit of data to be stored in each cell 15 on each track 14. Then a cell width or track width dimension W transverse to the direction of the track 14 is selected.

Then, one selects a non-transition cell 15 for one form of logic, such as logic 0, to be stored in each non-transition cell 15 and a transition cell 15 for the other form of logic, e.g., logic 1, to be stored in each other transition cell for the other form of logic, e.g., logic 1.

Next, depending upon the data to be encoded, a computer associated with a camera for making a data record carrier 10 on film negative material is programmed to direct or not direct a light beam, such as a laser light beam, onto the film negative emulsion while the camera is rotating through the specified arc to be subtended by the track 14.

After a first track 14 is formed or encoded, the camera is indexed a track spacing S and the above procedure is repeated.

In practicing the method for printing a data record carrier 10 of alternating reflective and non-reflective areas for cells 15 on a substrate 11, a mask or master film negative is utilized to print alternating dark or non-reflective areas and light or reflective areas on the paper substrate 11.

Also it is to be noted that it is immaterial whether the printing is identical to the negative or the reverse of the negative since it is the occurrence of a transition over a cell length L which is important and not whether the cell 15 is light (white) or dark, i.e., reflective or non-reflective.

In accordance with the teachings of the present invention and as will now be described in connection with the description of FIGS. 5 and 6, the tracks 14 are formatted and encoded with data bits in the cells 15 on the substrate 11 of the data record carrier 10 in such a manner as to provide encoding of data, compression of data, error detection and error correction as well as to facilitate location of and recognition of tracks 14.

Figure 5:
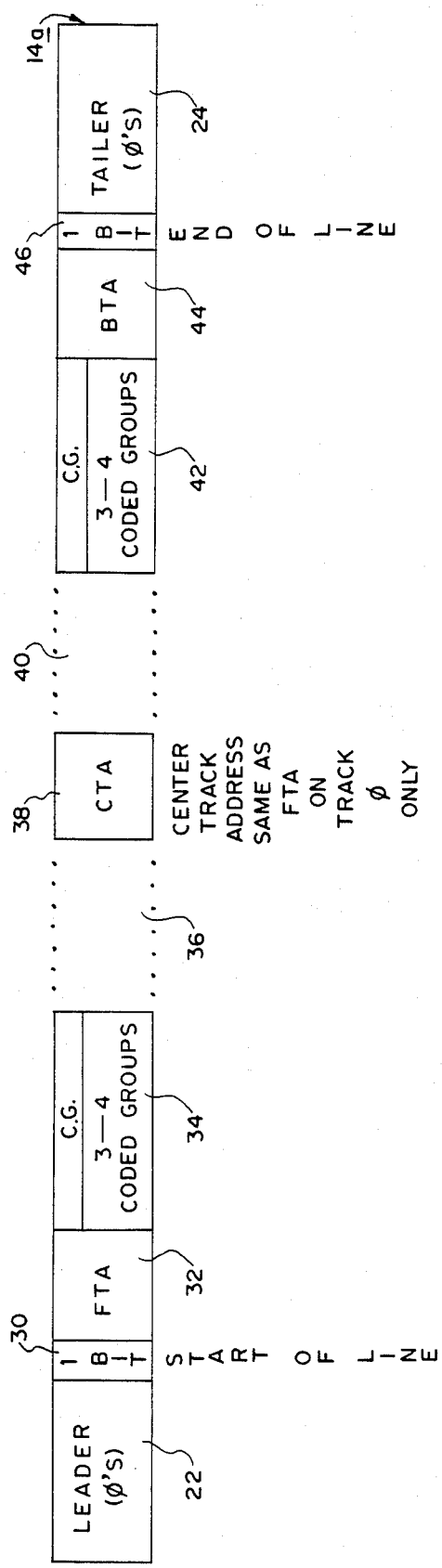
FIG. 5 is a block layout of the first or zero track.

To achieve these objectives the leading end and tail end of each track are mirror images of each other so that the first or zero track designated as track 14a in FIG. 5 can be readily identified, reading forward or backward. This first or zero track 14a is utilized by a reading or scanning device to align the data record carrier 10 and to obtain information about the data on the data record carrier 10, which information is read only by the computer or machine for transcribing data from the data record carrier 10.

Figure 6:
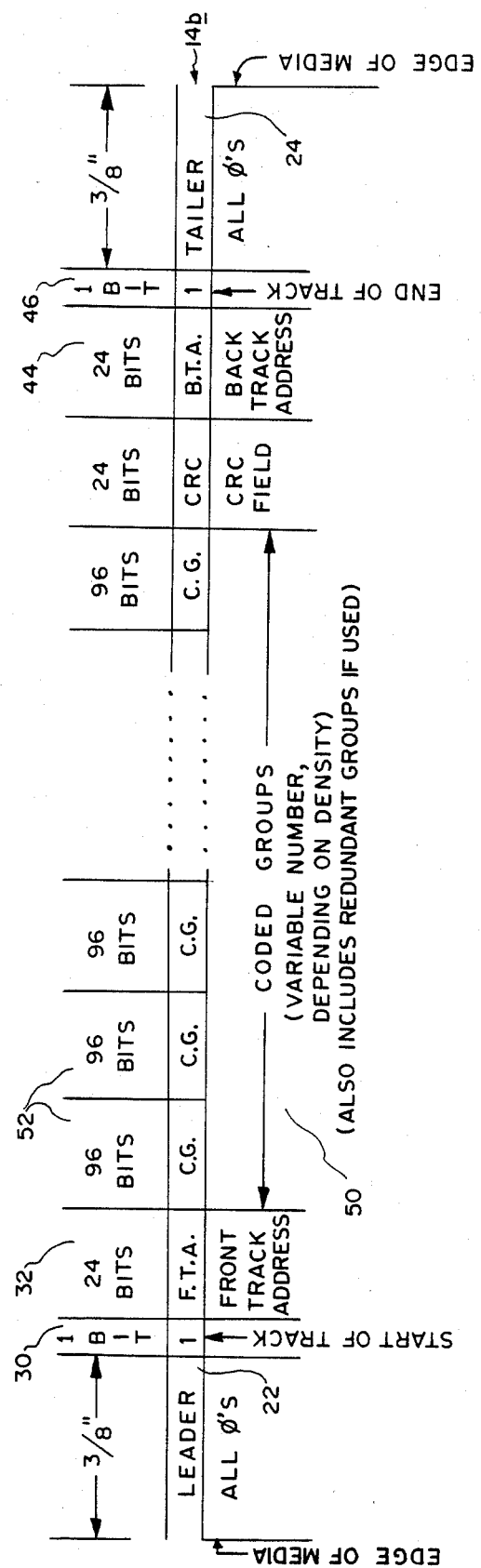
FIG. 6 is a block layout of the second through nth tracks on the data record carrier.

Information on this first or zero track 14a and on the second through nth tracks 14b shown in FIG. 6 is formatted and encoded thereon in a manner which prevents someone from reading the data from other than a properly programmed scanner or reading device.

Moreover, the data is placed in coded groups on the tracks 14a and 14b to enable reaction of missing data if there is an error, such as data missing from a track—a "burst error" such as is caused by a cigarette burn or the punching of a hole through the data record carrier 10.

Referring now to FIG. 5, the first or zero track 14a has the leader section 22 comprised of all zero data bits, namely of non-transition data cells 15. Likewise, the tailer 24 is comprised of a series of zero data bits or non-transition cells 15. This is apparent from FIG. 2 which shows the non-transition cells of leader section 22.

After the leader section 22 of non-transition cells there is a "start-of-line" section 30 which is a transition cell or a logic 1 bit of data. This one bit transition cell 30 separates the leader section 22 from a front track address (FTA) section 32. Such front track address section 32 can have up to 60 bits of address information.

Next there is formed on the track 14a a plurality of coded groups 34 which may be from 1 to 4 groups 34 and preferably 3 to 4 coded groups 34. These coded groups 34 are preferably so-called Hamming groups and have information encoded therein in the manner taught by Richard W. Hamming. For further details of how these groups can be coded, reference is made to *CODING AND INFORMATION THEORY*, by Richard W. Hamming, published by Prentice-Hall, 1980. Typically each coded group will have up to 8 twelve bit words of data.

Following the coded groups 34 on the first track 14a is a dead space 36. Next is a center track address (CTA) section 38 which is the same as the front track address section 32. Only the first or zero track 14a has a center track address section 38.

After the center track address section 38 on the first track 14a is a second dead space 40 followed by another plurality of coded groups 42 of data 12 which can be 1 to 4 in number and preferably 2 to 4 in number. Next is a back track address (BTA) section 44 which is separated from the tailer 24 by an "end-of-line" logic 1 data bit or transition cell 46. The back track address section 44 can have up to 60 bits of address data and is preferably formed on the track 14a in reverse manner to the front track address section 32 such that the tailer 24, transition cell 46 and back track address section 44 are a mirror image of the leader 24, the transition cell 30 and the front track address section 32.

The number of coded groups 34 and of the coded groups 42 will depend upon the size of the data cells 15 utilized and the amount of data that is to be stored on the first or zero track 14a. In this respect, if the cells 15 are large, i.e., a low density data track, then only 1 or 2 coded groups 34,42 will be provided on the first or zero track 14a. Alternatively, if it is a high density track with small cells 15, then up to four coded groups 34, 42 will be provided at the beginning and end of the track 14a.

This first track 14a will be readably only by the computer associated with a reader or scanning device and will contain information regarding (a) the machine code used, (b) the program load address, (c) the program size, (d) the number of tracks 14 on the substrate 11, (e) the spacing between tracks 14, (f) the type of data stored on the tracks 14, (g) the coded groups per track 14b, (h) the compression and error coding flags and (i) other special information for the computer only.

It will be appreciated that by having the tail end of the track 14a formed as a mirror image of the leading end of the track 14a, a reader or scanning device can read the track 14a frontward or backward to find out which track it is.

Referring now to FIG. 6, it will be readily apparent that the leading end and tailing end of each of the second through nth tracks 14b are substantially identical to the leading end and tail end of the first track 14a. In this respect, each track 14b includes a leader 22 composed of non-transition cells 15, a transition cell 30, a front track address section 32, a back track address section 44, a transition cell 46 and a tailer section 24 comprised of non-transition cells 15.

Again, the tailer and back track address sections 24 and 44 are mirror images of the leader and front track address section 22 and 32. Also as shown in FIG. 6 the leader and tailer sections are preferably ⅜ inch long and extend to the side edges of the substrate 11.

In the middle of each track 14b between the front track address section and the back track address section 34, there is formed a plurality 50 of coded groups 52 containing the digital data recorded and stored on the substrate 11 of the data record carrier 10. As shown, the coded groups 52 will vary in number depending upon the density of the cells 15, i.e., on the size of the cells 15. Also, as shown, each group 52 of the plurality 50 of coded groups 52 includes 96 bits of data and is coded so that only a properly programmed scanner or reading device can read the data 12. Again, the coded groups 52 are preferably Hamming groups having coded groups of data bits that are coded or formatted according to the techniques taught by Richard Hamming in his book *CODING AND INFORMATION THEORY* referred to above.

Preferably, a cyclic redundancy checksum (CRC) field section 60 is formed on each track 14b at the end of the plurality 50 of coded groups 52 and before the back track address section 44. This cyclic redundancy checksum field section 60 is typically a 16-bit word derived from the original user data on the track 14 using the industry standard CCITT polynomial to generate a checksum of each track's input data. The function of this CRC section 60 is to perform error detection only and the value of the CRC section is recorded at the end of each track 14b and is used to determine if the data on the track 14b was retrieved properly. The CRC section 60 can consist of two twelve bit words as shown in FIG. 6. Further, as an alternative, such CRC field can be included in the front track address section 32 or back track address section 44.

It will be appreciated from FIG. 6 that each of the coded groups 52 includes 96 bits or eight twelve bit words. Accordingly, the user data is stored at eight bit bytes in the plurality 50 of groups 52. Additional information is added during the recording process for error correction, error detection and housekeeping. This additional information is used by the reader or scanning device to allow error-free reading of imperfect data and is deleted from the user data prior to the data being delivered to the host. That is to say, the original data is reconstructed and put out unaltered.

Again, as stated above, the twelve bit words are coded so that a "best guess" can be made of the proper data byte if there is a "burst error", i.e., data missing, such as occasioned by the punching of a hole in the data record carrier 10 when putting it on a spindle, or by a cigarette burn on the substrate 11.

Also, it is important to note that the tracks can be read forward or backward and there is no need for any synchronization flags since a reader or scanning device will know exactly which track it is reading when reading forward or backward. Also, the single transition cells (logic 1 bits) 30 and 46 indicate the start or end of a track 14 and the start and end of the data area on the tracks 14a and 14b.

From the foregoing description it is apparent that the method for forming a data record carrier 10 and the data record carrier 10 formed thereby have a number of advantages, some of which have been described above and others of which are inherent in the invention.

Also from the foregoing description it will be apparent to those skilled in the art that modifications may be made to the data record carrier 10 of the present invention without departing from the teachings of the present invention. Accordingly, the scope of the invention is only to be limited as necessitated by the accompanying claims.

I claim:

1. A method for formatting optically encoded digital data on a planar substrate without timing or synchronization data to form a data record carrier including the steps of: selecting an arcuate track path on the substrate for each one of a plurality of tracks of data; selecting a data cell length in the direction of each track for each bit of data to be stored in each cell on each track; selecting a cell width dimension transverse to the direction of the track; selecting a non-transition cell for one form of logic (0 to 1) to be stored in each such cell; selecting a transition cell for the other form of logic (1 or 0) to be stored in each such other cell; establishing a leader section for each track; establishing a tailer section for each track; establishing a front track address section for each track; establishing a back track address section for each track and creating on said substrate a plurality of such arcuate tracks with the above parameters, and with each track being spaced from an adjacent track along a common centerline of the tracks, and each track having the same radius throughout the arcuate path of the track such that the tracks extend in an arcuate manner across the data record carrier and are arranged in a nested manner relative to adjacent tracks along said common centerline.

2. The method of claim 1 wherein said leader and tailer sections comprise a series of non-transition cells.

3. The method of claim 1 wherein said leader and tailer sections are each about ⅜ inch long.

4. The method of claim 1 wherein said back track address is a mirror image of said front track address.

5. The method of claim 1 wherein said leader section and front track address section are separated by one transition cell and said tailer section and said back track address section are separated by one transition cell.

6. The method of claim 1 wherein the first track of the plurality of tracks is formed with a center track address identical to the front track address and located approximately midway between the ends of said first track.

7. The method of claim 6 wherein said first track is formed with at least one coded group of cells following said front track address section and at least one coded group of cells before said back track address section.

8. The method of claim 7 wherein said coded groups can be up to four in number.

9. The method of claim 7 wherein said coded groups are Hamming groups.

10. The method of claim 7 wherein said coded groups are adapted to be read by a computer only and contain information regarding (a) the machine code used, (b) the program load address, (c) the program size, (d) the number of tracks, (e) the spacing between tracks, (f) the type of data stored on the tracks, (g) the coded groups per track, (h) the compression and error coding flags, and (i) other special information for the computer only.

11. The method of claim 7 wherein said first track is formed with dead space between the center track and the coded groups on either side thereof.

12. The method of claim 7 wherein said track address and coded groups are composed of eight bit bytes.

13. The method of claim 1 wherein the second through nth track each have the leader section separated from the front track address section by a transition cell and the back track address section separated from the tailer section by a transition cell and wherein said method includes the step of placing on each track a plurality of coded groups between the front track address and the back track address.

14. The method of claim 13 including the step of placing a cyclic redundancy check group on each track before the back track address section.

15. The method of claim 13 wherein said coded groups are 3 to 20 in number depending on the density of the cells in the track.

16. The method of claim 13 wherein each coded group comprises eight twelve bit words.

17. The method of claim 13 wherein said coded groups are Hamming groups.

18. The method of claim 14 wherein each cyclic redundancy check group comprises two twelve bit words.

19. The method of claim 14 wherein each cyclic redundancy check group comprises a 16 bit word.

20. The method of claim 1 wherein said tracks are arcuate tracks of equal radius arranged in a nested array equally spaced from one another.

21. The method of claim 1 wherein each non-transition cell is fully transmissive or fully opaque and each transition cell is transmissive along part of the length thereof and partially opaque along the remaining length thereof.

22. The method of claim 1 wherein each non-transition cell is fully reflective or fully non-reflective and each transition cell is partially reflective along part of the length thereof and partially non-reflective along the remaining length thereof.

23. A data record carrier without timing or synchronization data, said data record carrier including a plurality of arcuate spaced apart tracks on a planar substrate with each track having a plurality of data cells therein, each track being spaced from an adjacent track by a predetermined distance along a common centerline of the tracks and each track having the same radius throughout the arcuate path of said track such that the tracks extend in an arcuate manner across the data record carrier and are arranged in a nested manner relative to adjacent tracks along a common centerline, each cell having the same cell length in the direction of each track for each bit of data stored in each cell and the same cell width in a direction transverse to the direction of each track; each cell for one form of logic (0 or 1) being a non-transition cell, each cell for the other form of logic (1 or 0) being a transition cell, and each track having a leader section, a tailer section, a front track address section and a back track address section.

24. The data record carrier of claim 23 wherein said leader and tailer sections comprise a series of non-transition cells.

25. The data record carrier of claim 23 wherein said leader and tailer sections are each about ⅜ inch long.

26. The data record carrier of claim 23 wherein said back track address is a mirror image of said front track address.

27. The data record carrier of claim 23 wherein said leader section and front track address section are separated by one transition cell and said tailer section and said back address section are separated by one transition cell.

28. The data record carrier of claim 23 wherein the first track of the plurality of tracks includes a center track address identical to the front track address and is located approximately midway between the ends of said first track.

29. The data record carrier of claim 28 wherein said first track includes at least one coded group of cells following said front track address section and at least one coded group of cells before said back track address section.

30. The data record carrier of claim 29 wherein said coded groups can be up to four in number.

31. The data record carrier of claim 29 wherein said coded groups are Hamming groups.

32. The data record carrier of claim 29 wherein said coded groups are adapted to be read by a computer only and contain information regarding (a) the machine code used, (b) the program load address, (c) the program size, (d) the number of tracks, (e) the spacing between tracks, (f) the type of data stored on the tracks, (g) the coded groups per track, (h) the compression and error coding flags, and (i) other special information for the computer only.

33. The data record carrier of claim 29 wherein said first track includes dead space between the center track and the coded groups on either side thereof.

34. The data record carrier of claim 29 wherein said track address and coded groups are composed of twelve bit words.

35. The date record carrier of claim 23 wherein the second through nth track each have the leader section separated from the front track address section by a transition cell and the back track address section separated from the tailer section by a transition cell and a plurality of coded groups between the front track address and the back track address.

36. The data record carrier of claim 35 including a cyclic redundancy check group on each track before the back track address section.

37. The data record carrier of claim 35 wherein said coded groups are 3 to 20 in number depending on the density of the cells in the track.

38. The data record carrier of claim 35 wherein each coded group comprises eight twelve bit words.

39. The data record carrier of claim 35 wherein said coded groups are Hamming groups.

40. The data record carrier of claim 36 wherein each cyclic redundancy group comprises two twelve bit words.

41. The data record carrier of claim 36 wherein each cyclic redundancy check group comprises a 16 bit word.

42. The data record carrier of claim 23 wherein said tracks are arcuate tracks of equal radius arranged in a nested array equally spaced from one another.

43. The data record carrier of claim 23 wherein each non-transition cell is fully transmissive or fully opaque and each transition cell is transmissive along part of the length thereof and partially opaque along the remaining length thereof.

44. The data record carrier of claim 23 wherein each non-transition cell is fully reflective or fully non-reflective and each transition cell is partially reflective along part of the length thereof and partially non-reflective along the remaining length thereof.

45. A method for optically encoding digital data without timing or synchronization data on a planar substrate to form a data record carrier including the steps of: selecting arcuate track paths on the substrate; selecting a data cell length in the direction of the track for each bit of data to be stored in each cell on each track; selecting a cell width dimension transverse to the direction of the track; selecting a non-transition cell for one form of logic (0 or 1) to be stored in each such cell; selecting a transition cell for the other form of logic (1 or 0) to be stored in each such other cell; creating a plurality of arcuate tracks of digital data on the substrate comprised of a series of said cells each having the same cell length in the direction of the track, said plurality of tracks being arranged in a nested array of tracks equally spaced from each other by a predetermined distance, along a common centerline of said tracks, each track having the same radius throughout the arcuate path of said track such that the tracks extend in an arcuate manner across the data record carrier, and said predetermined distance being a center-to-center spacing between adjacent tracks of 0.001 inch to 0.011 inch and each said track having a thickness of 0.0007 inch to 0.010 inch.

46. A data record carrier without timing or synchronization data, said data record carrier including a planar substrate and digital data on the substrate in the form of a plurality arcuate of tracks each having therein a plurality of data cells for each bit of data (0 or 1) stored therein, each cell having the same cell length in the direction of the track and the same cell width in a direction transverse to the direction of the track, each cell for one form of logic (0 or 1) being a non-transition cell and each cell for the other form of logic (1 or 0) being a transition cell, each track being spaced from an adjacent track by a predetermined distance along a common centerline of said tracks, each track having the same radius throughout the arcuate path of said track such that the tracks extend in an arcuate manner across the data record carrier and are nested relative to adjacent tracks along said common centerline, and said predetermined distance being a center-to-center spacing between tracks of 0.001 inch to 0.011 inch and each track having a thickness of 0.0007 inch to 0.010 inch.

47. The method of claim 14 wherein each cyclic redundancy check group is included in the front track address section or the back track address section.

* * * * *